(12) United States Patent
Hammond

(10) Patent No.: US 11,361,940 B2
(45) Date of Patent: Jun. 14, 2022

(54) PUSH-PULL POWER SUPPLY FOR MULTI-MESH PROCESSING CHAMBERS

(71) Applicant: Applied Materials, Inc., Santa Clara, CA (US)

(72) Inventor: Edward P. Hammond, Hillsborough, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/068,994

(22) Filed: Oct. 13, 2020

(65) Prior Publication Data

US 2022/0115206 A1    Apr. 14, 2022

(51) Int. Cl.
*H01J 37/32* (2006.01)
*C23C 16/509* (2006.01)

(52) U.S. Cl.
CPC .......... *H01J 37/321* (2013.01); *C23C 16/509* (2013.01); *H01J 37/32183* (2013.01); *H01J 37/32715* (2013.01)

(58) Field of Classification Search
CPC ............... H01J 37/321; H01J 37/32183; H01J 37/32715; C23C 16/509
See application file for complete search history.

(56) References Cited

U.S. PATENT DOCUMENTS

| 6,818,103 | B1 | 11/2004 | Scholl et al. | |
| 11,011,347 | B2* | 5/2021 | Hayashi | H01J 37/20 |
| 2007/0284344 | A1* | 12/2007 | Todorov | H05H 1/46 |
| | | | | 219/121.54 |
| 2011/0192349 | A1 | 8/2011 | Hammond et al. | |
| 2012/0247679 | A1* | 10/2012 | Yamazawa | H01J 37/3244 |
| | | | | 156/345.48 |
| 2013/0284709 | A1* | 10/2013 | Makhratchev | B23K 10/00 |
| | | | | 219/121.43 |

(Continued)

FOREIGN PATENT DOCUMENTS

| CN | 110867406 A | 3/2020 |
| JP | 2678381 B2 | 11/1997 |

(Continued)

OTHER PUBLICATIONS

International Search Report & Written Opinion dated Feb. 4, 2022 in International Patent Application No. PCT/US2021/054354, 7 pages.

*Primary Examiner* — Renan Luque
(74) *Attorney, Agent, or Firm* — Kilpatrick Townsend & Stockton LLP

(57) ABSTRACT

A radio-frequency (RF) power circuit for a multi-electrode cathode in a processing chamber may include an RF source and inductive element(s) that are conductively coupled to the RF source. A first inductive element may be inductively coupled to the inductive element(s), and the first inductive element may be configured to receive a first portion of RF power originating from the RF source and provide the first portion of the RF power for a first pedestal electrode. A second inductive element may also be inductively coupled to the inductive element(s), and the second inductive element may be configured to receive a second portion of RF power originating from the RF source through the inductive element(s) and provide the second portion of the RF power for a second pedestal electrode.

20 Claims, 11 Drawing Sheets

(56) References Cited

U.S. PATENT DOCUMENTS

| | | | |
|---|---|---|---|
| 2016/0066404 A1* | 3/2016 | Habu | G01J 3/027 |
| | | | 315/223 |
| 2017/0069464 A1* | 3/2017 | Ye | H01L 21/6831 |
| 2017/0111025 A1* | 4/2017 | Kapoor | H03H 1/0007 |
| 2018/0114675 A1* | 4/2018 | Lee | H01J 37/32183 |
| 2020/0043703 A1* | 2/2020 | French | H01J 37/32541 |

FOREIGN PATENT DOCUMENTS

| | | | |
|---|---|---|---|
| KR | 20010002501 A * | 1/2001 | |
| WO | 2005-114694 A1 | 12/2005 | |
| WO | 2019-169102 A1 | 9/2019 | |

\* cited by examiner

PUSH-PULL POWER SUPPLY FOR MULTI-MESH PROCESSING CHAMBERS

TECHNICAL FIELD

This disclosure generally relates to systems and methods for tuning a plasma in a semiconductor substrate manufacturing process. More specifically, this disclosure discusses systems and methods for controlling individual radio-frequency (RF) voltages that applied to different conductive meshes in a pedestal to uniformly control the plasma.

BACKGROUND

In the manufacture of integrated circuits and other electronic devices, plasma processes are often used for deposition or etching of various material layers. Plasma-enhanced chemical vapor deposition (PECVD) process is a chemical process wherein electro-magnetic energy is applied to at least one precursor gas or precursor vapor to transform the precursor into a reactive plasma. Plasma may be generated inside the processing chamber, i.e., in-situ, or in a remote plasma generator that is remotely positioned from the processing chamber. This process is widely used to deposit materials on substrates to produce high-quality and high-performance semiconductor devices.

Transistor structures have become increasingly complicated and challenging as feature size continues to decrease. To meet processing demands, advanced processing control techniques are useful to control cost and maximize substrate and die yield. Normally, the dies at certain locations of the substrate suffer yield issues when the plasma is not controlled uniformly across the surface area of the substrate. On the substrate processing level, there is a need for advancements in process uniformity control to allow fine, localized process tuning as well as global processing tuning across the whole substrate when controlling the plasma. Therefore, there is a need for methods and apparatus to allow fine, localized process tuning throughout the entirety of the substrate.

BRIEF SUMMARY

In some embodiments, a radio-frequency (RF) power circuit for a multi-electrode cathode in a processing chamber may include an RF source, one or more inductive elements that are conductively coupled to the RF source, and a first inductive element that is inductively coupled to the one or more inductive elements. The first inductive element may be configured to receive a first portion of RF power originating from the RF source through the one or more inductive elements, and to provide the first portion of the RF power originating from the RF source for a first pedestal electrode in the processing chamber. The power circuit may also include a second inductive element that is inductively coupled to the one or more inductive elements. The second inductive element may be configured to receive a second portion of RF power originating from the RF source through the one or more inductive elements, and to provide the second portion of the RF power originating from the RF source for a second pedestal electrode in the processing chamber.

In some embodiments, an RF power circuit for a multi-electrode cathode in a processing chamber may include an RF source, a first inductive element that may be configured to receive a first portion of RF power originating from the RF source, and to provide the first portion of the RF power originating from the RF source for a first pedestal electrode in the processing chamber. The power circuit for may also include a second inductive element that may be configured to receive a second portion of RF power originating from the RF source, and to provide the second portion of the RF power originating from the RF source for a second pedestal electrode in the processing chamber. The power circuit for may also include a capacitive element that may separate the first inductive element from the second inductive element.

In some embodiments, a method of powering a multi-electrode cathode in a processing chamber may include generating RF power using an RF source, transmitting the RF power through one or more inductive elements that are conductively coupled to the RF source, inductively coupling a first portion of the RF power from the one or more inductive elements to a first inductive element, providing the first portion of the RF power from the first inductive element to a first pedestal electrode in the processing chamber, inductively coupling a second portion of RF power from the one or more inductive elements to a second inductive element, and providing the second portion of the RF power from the second inductive element to a second pedestal electrode in the processing chamber.

In any embodiments, any and/or all of the following features may be included in any combination and without limitation. The one or more inductive elements may include a third inductive element and a fourth inductive element, where the third inductive element may be inductively coupled to the first inductive element, and the fourth inductive element may be inductively coupled to the second inductive element. The power circuit may also include a first DC source that is conductively coupled to the first inductive element, and a second DC source that is conductively coupled to the second inductive element, where the capacitive element may isolate the first DC source from the second DC source. A voltage difference between the first DC source and the second DC source may represent a bipolar chucking voltage that holds a substrate to a pedestal in the processing chamber. The power circuit may also include a tuning circuit configured to siphon a portion of the RF power such that power delivered to the first pedestal electrode is different from power delivered to the second pedestal electrode. The tuning circuit may include a parasitic inductor. The tuning circuit may include a parasitic capacitor. The first pedestal electrode may include a wire mesh. A phase difference between the RF source and the second RF source may rotate an energy transferred to a plasma in the processing chamber. The first pedestal electrode, the second pedestal electrode, the third pedestal electrode, and the fourth pedestal electrode may be located in separate quadrants of the pedestal in the processing chamber. The first pedestal electrode may include a circular mesh in a center of a pedestal, and the second pedestal electrode may include a ring mesh around a periphery of the pedestal. The first inductive element may include an inductive value of approximately 1 µH.

In any embodiments, the power circuit may also include a second RF source, second one or more inductive elements that are conductively coupled to the RF source, and a third inductive element that may be inductively coupled to the second one or more inductive elements, where the third inductive element may be configured to receive a first portion of RF power originating from the second RF source through the second one or more inductive elements, and to provide the first portion of the RF power originating from the second RF source for the first pedestal electrode in the processing chamber. The power circuit may further include a fourth inductive element that may be inductively coupled to the second one or more inductive elements, where the fourth inductive element may be configured to receive a second portion of RF power originating from the second RF source through the second one or more inductive elements, and to provide the second portion of the RF power originating from the second RF source for the second pedestal electrode in the processing chamber. The third inductive element and the fourth inductive element may have a same inductance. The third inductive element and the fourth inductive element may be configured to block the RF power originating from the RF source. The first inductive element and the second inductive element may be configured to block the RF power originating from the second RF source. The RF source may have a frequency of approximately 13 MHz and the second RF source may have a frequency of approximately 40 MHz.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Described herein are embodiments for controlling a plasma across the surface area of a substrate. The disclosure provides radio-frequency (RF) circuits and methods to adjust the distribution of RF power to more than one mesh embedded in a substrate support or pedestal that also functions as an electrostatic chuck. The methods and systems described herein may apply whether the embedded meshes are a source of RF power (e.g., an electrode or electrodes), or whether the meshes are the destination for RF power (e.g., ground). Embodiments disclosed herein allow the modulation of the plasma profile uniformity above a substrate. Changing the plasma distribution leads to improved uniformity of film parameters on the substrate including, for example, deposition rate, film stress, refractive index, as well as other parameters.

Figure 1:
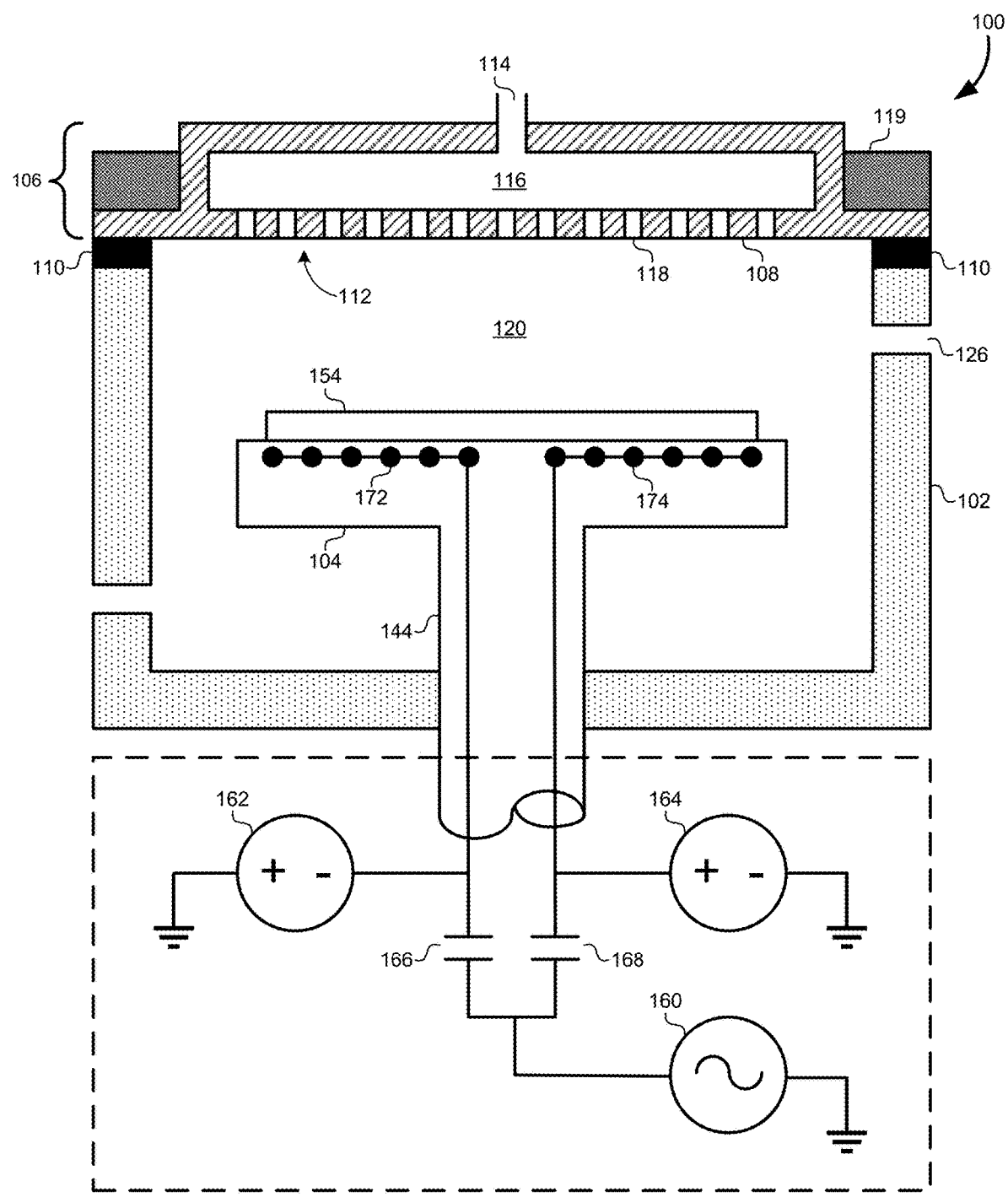
FIG. 1 illustrates a cross-sectional view of a processing chamber, according to some embodiments.

FIG. 1 illustrates a cross-sectional view of a processing chamber 100, according to some embodiments. As shown, the processing chamber 100 may be an etch chamber suitable for etching a substrate 154. Examples of processing chambers that may be adapted to benefit from the embodiments describe herein may include the Producer® Etch Processing Chamber, and the Precision™ Processing Chamber, commercially available from Applied Materials, Inc., located in Santa Clara, Calif. It is contemplated that other processing chambers, including those from other manufacturers, may be adapted to benefit from these embodiments.

The processing chamber 100 may be used for various plasma processes. For example, the processing chamber 100 may be used to perform dry etching with one or more etching agents. The processing chamber may be used for ignition of plasma from a precursor $C_xF_y$ (where x and y represent values for known compounds), $O_2$, $NF_3$, or combinations thereof. In another example, the processing chamber 100 may be used for a plasma-enhanced chemical vapor deposition (PECVD) process with one or more precursors.

The processing chamber 100 may include a chamber body 102, a lid assembly 106, and a support assembly 104. The lid assembly 106 is positioned at an upper end of the chamber body 102. The support assembly 104 may be disposed inside the chamber body 102, and the lid assembly 106 may be coupled to the chamber body 102 and enclose the support assembly 104 in a processing volume 120. The chamber body 102 may include a transfer port 126, which may include a slit valve, formed in a sidewall of the chamber body 102. The transfer port 126 may be selectively opened and closed to allow access to an interior of the processing volume 120 by a substrate handling robot (not shown) for substrate transfer.

An electrode 108 may be provided as a portion of the lid assembly 106. The electrode 108 may also function as a gas distributor plate 112 having a plurality of openings 118 for admitting process gas into the processing volume 120. The process gases may be supplied to the processing chamber 100 via a conduit 114, and the process gases may enter a gas mixing region 116 prior to flowing through the openings 118. The electrode 108 may be coupled to a source of electric power, such as an RF generator, DC power, pulsed DC power, pulsed RF, and/or the like. An isolator 110 may contact the electrode 108 and separate the electrode 108 electrically and thermally from the chamber body 102. The isolator 110 may be constructed using a dielectric material such aluminum oxide, aluminum nitride, and/or other ceramics or metal oxides. A heater 119 may be coupled to the gas distributor plate 112. The heater 119 may also be coupled to an AC power source.

The support assembly 104 may be coupled to a lift mechanism through a shaft 144, which extends through a bottom surface of the chamber body 102. The lift mechanism may be flexibly sealed to the chamber body 102 by a bellows that prevents vacuum leakage from around the shaft 144. The lift mechanism may allow the support assembly 104 to be moved vertically within the chamber body 102 between a transfer position and a number of process positions to place the substrate 154 in proximity to the electrode 108.

The support assembly 104 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the support assembly 104. One or more pedestal electrodes may be configured to deliver RF energy to a plasma in the processing volume 120. For example, an RF source 160 may be provided outside of the chamber body 102 to provide RF energy to one or more pedestal electrodes in the support assembly 104. The RF energy may be transferred through the one or more pedestal electrodes to a gas in the processing volume 120 that is deposited through the gas distributor plate 112 (also referred to as a "showerhead") to generate a plasma. The plasma may be maintained above the substrate 154 to deposit a layer of material on the substrate 154. In order to uniformly deposit material on the substrate 154, the energy transferred to the plasma should be maintained uniformly across the surface area of the substrate 154.

A number of technical challenges may create difficulties for maintaining this uniform plasma. A first technical challenge involves the size of the substrate 154 in relation to the size of the wavelength of the RF energy applied to the plasma. The RF source 160 may operate at typical voltages, such as approximately 13 MHz. When the substrate 154 is approximately 2.0 m to 2.5 m, the size of the wavelength at 13 MHz may be a significant fraction of the diameter of the substrate 154. Inside a plasma environment, that wavelength may effectively shrink by a factor of 2 or 3. For example, as a quarter wavelength oscillates between a minimum voltage and a maximum voltage, a standing wave may be formed across the surface of the substrate 154 as energy is transferred to the plasma in the chamber body 102. This may cause significant nonuniformities in the plasma, resulting in an uneven deposition of material on the substrate 154. This effect is even more pronounced at higher voltages, such as 40 MHz where the full wavelength may be comparable to the size of the substrate 154. As the wave oscillates, there may be areas of the plasma that are at a maximum voltage, while other areas are at a zero voltage, resulting in a very nonuniform process. Therefore, solutions are needed to modulate the RF voltage across a plurality of pedestal electrodes such that the nonuniformities may be averaged over time as the standing wave generated by the pedestal electrodes is rotated or otherwise moved over time. As described below, an RF signal may be applied to multiple electrodes at multiple points in the support assembly 104, and/or the shape of the standing wave may be modulated by tuning the phase of the different RF signals applied to the different electrodes. As the standing wave pattern is moved quickly across the plasma, nonuniformities may be averaged out over time such that the plasma maintains a certain crystalline infraction such that it can stay amorphous.

A second technical challenge involves ensuring that the RF signal provided to each of a plurality of pedestal electrodes is equal. For example, in FIG. 1, a method known as bipolar chucking is used with a first pedestal electrode 172 and a second pedestal electrode 174. Bipolar chucking is a method of applying a DC voltage difference between the first pedestal electrode 172 and the second pedestal electrode 174. This electrostatic difference serves to hold the substrate 154 to the support assembly 104. This may be contrasted with monopolar chucking where only a single pedestal electrode is used, or where a DC voltage is only applied to a single pedestal electrode. Monopolar chucking only becomes effective when energy is applied to the plasma to complete the circuit. Bipolar chucking uses two separate electrical paths from the RF source 160 to each of the first pedestal electrode 172 and the second pedestal electrode 174. In the example of FIG. 1, a first DC voltage source 162 is applied to a first electrical pathway for the first pedestal electrode 172. A second DC voltage source 164 is applied to a second electrical pathway for the second pedestal electrode 174. The first electrical pathway may include a first capacitor 166, and the second electoral pathway may include a second capacitor 168 in order to isolate the DC voltage sources 162, 164 from each other. In some embodiments, each of the capacitors 166, 168 may be relatively large, such as 50 nF to block the DC voltage. However, splitting the output of the RF source 160 into two electrical pathways may cause an amount of RF energy transmitted to each of the pedestal electrodes 172, 174 to differ. Therefore, solutions are needed to maintain isolation while still ensuring a push-pull equalization between the two pedestal electrodes 172, 174.

The first pedestal electrode 172 and the second pedestal electrode 174 may be provided in the support assembly 104. The first pedestal electrode 172 and the second pedestal electrode 174 may be embedded within the support assembly 104 and/or coupled to a surface of the support assembly 104. The first pedestal electrode 172 and the second pedestal electrode 174 may be a plate, a perforated plate, a mesh, a wire screen, or any other distributed conductive arrangement. Although FIG. 1 illustrates only two pedestal electrodes, other embodiments may use more than two pedestal electrodes having different geometries and/or arrangements in the support assembly 104 as described in detail below.

Figure 2:
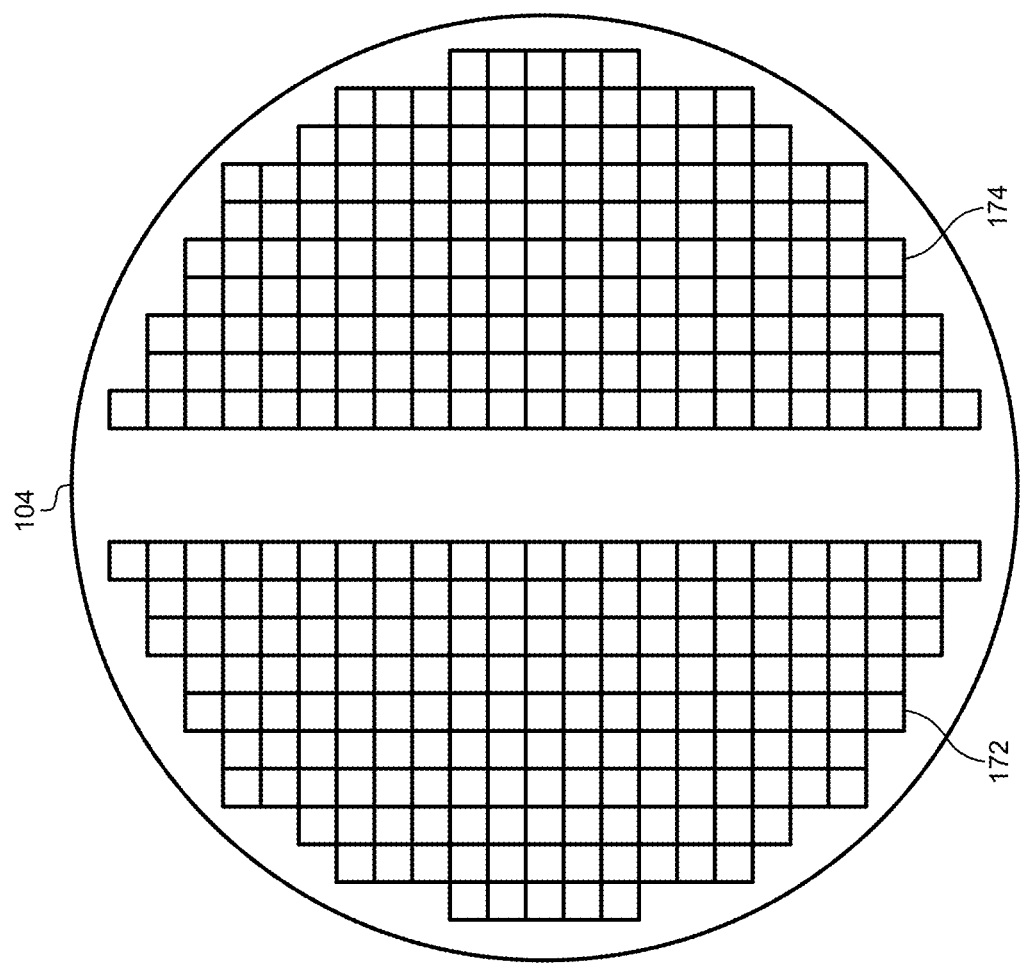
FIG. 2 illustrates a configuration for two pedestal electrodes, according to some embodiments.

FIG. 2 illustrates a configuration for two pedestal electrodes, according to some embodiments. In this example, the first pedestal electrode 172 and the second pedestal electrode 174 may divide the support assembly 104 in half, with the pedestal electrodes 172, 174 being arranged such that they each substantially fill approximately one half of the support assembly 104. For example, each of the pedestal electrodes 172, 174 may be shaped as a "D" or half-circle to fill approximately one half of the area of the support assembly 104. A gap may be maintained at the center of the support assembly 104 between the two pedestal electrodes 172, 174 such that the pedestal electrodes 172, 174 may remain electrically isolated from each other within the support assembly 104.

FIG. 2 illustrates each of the pedestal electrodes 172, 174 as a wire mesh formed in a rectangular pattern. For example, the wire mesh may be formed from a material such as molybdenum that has a similar thermal coefficient of expansion as the material used for the support assembly 104. This allows the support assembly 104 and the pedestal electrodes 172, 174 to expand and contract uniformly as heat is applied to the support assembly 104 and the substrate 154 when the processing chamber is in operation. In some embodiments, the mesh rectangular pattern formed by the pedestal electrodes 172, 174 may include a regular rectangular pattern having approximately a 1.0 mm pitch with wires that are approximately 0.05 mm thick.

Figure 3:
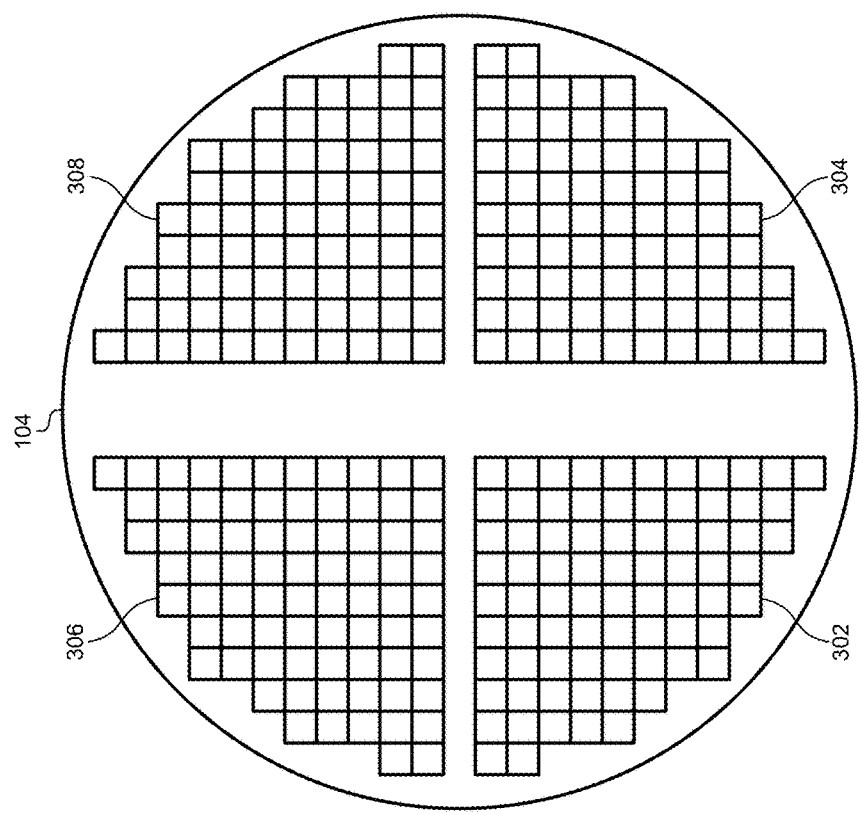
FIG. 3 illustrates an alternate configuration for a plurality of pedestal electrodes, according to some embodiments.

FIG. 3 illustrates an alternate configuration for a plurality of pedestal electrodes, according to some embodiments. In this example, the support assembly 104 may include four pedestal electrodes 302, 304, 306, 308 that are arranged in quadrants of the support assembly 104. Each of the electrodes 302, 304, 306, 308 may be formed using a wire mesh as described above. The wire meshes may be arranged to form a pie-shaped geometry that substantially fills a quadrant of the support assembly 104. Note that the four pedestal electrodes 302, 304, 306, 308 illustrated in FIG. 3 are provided only by way of example and are not meant to be limiting. Other embodiments may use more or fewer pedestal electrodes by dividing the geometry of the support assembly 104 into any number of subdivisions. For example, eight pedestal electrodes may be used by dividing the support assembly 104 into eight octants, and the pedestal electrodes may be shaped to substantially fill each of the resulting eight octants.

Figure 4:
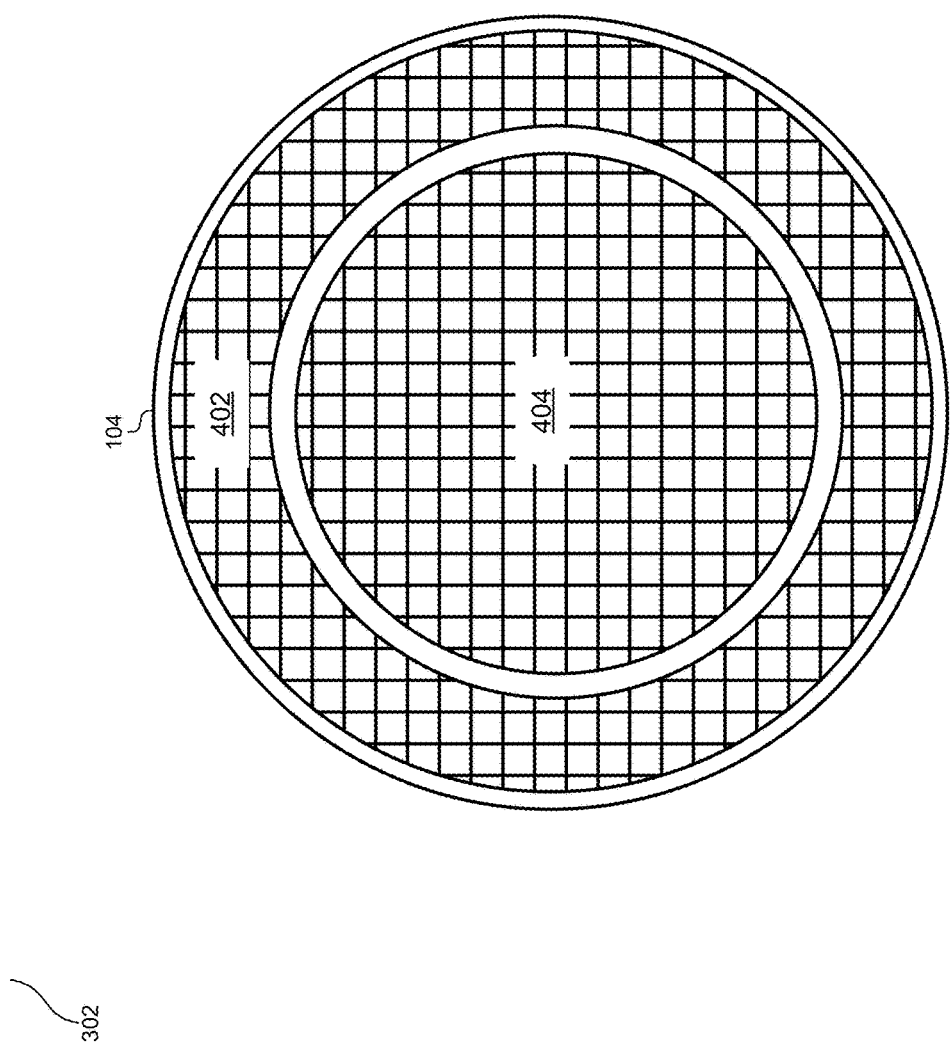
FIG. 4 illustrates a pedestal electrode configuration used to balance RF energy between a center portion of the support assembly and an outer portion of the support assembly, according to some embodiments.

FIG. 4 illustrates a pedestal electrode configuration used to balance RF energy between a center portion of the support assembly 104 and an outer portion of the support assembly 104, according to some embodiments. In this example, a first pedestal electrode 404 may form a first circular shape as a circular mesh approximately filling a center portion of the support assembly 104. A second pedestal electrode 402 may form a ring around the first pedestal electrode 404 to form a ring mesh that substantially fills a space remaining between an outer edge of the support assembly 104 and the outside boundary of the first pedestal electrode 404. The second pedestal electrode 402 may form a concentric ring around the first pedestal electrode 404. This geometry allows a first RF signal to be applied to the central first pedestal electrode 404 and a second RF signal to be applied to the second pedestal electrode 402. Tuning the relative phase between these two RF signals may be used to oscillate the shape of the energy generated in the plasma between a center portion of the support assembly 104 and an outer portion of the support assembly 104.

Figure 5:
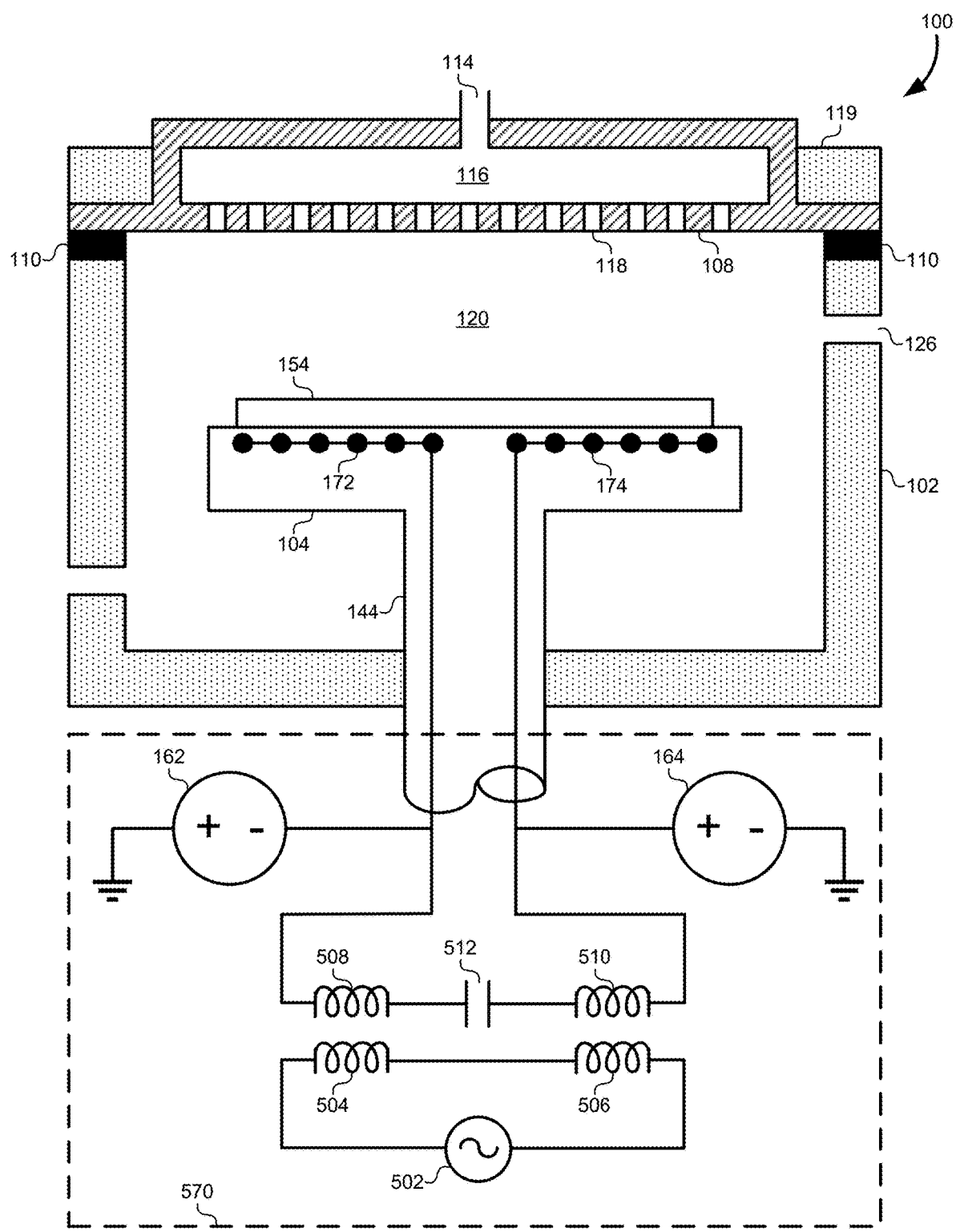
FIG. 5 illustrates a configuration of a power circuit that uses inductive coupling to isolate electrical paths between different pedestal electrodes while maintaining an equalized push-pull signal between the two pedestal electrodes, according to some embodiments.

FIG. 5 illustrates a configuration of an RF power circuit 570 that uses inductive coupling to isolate electrical paths between different pedestal electrodes while maintaining an equalized push-pull signal between the two pedestal electrodes, according to some embodiments. The RF power circuit 570 may include an RF source 502. Various frequencies may be used for the RF source, ranging from 350 kHz on the low-end up to frequencies in the very high-frequency (VHF) range. For example, some embodiments may use frequencies such as 13.56 MHz, 27.12 MHz, or 40.68 MHz. The RF source 502 may generate RF signals that propagate RF power, and which may be described as originating from the RF source 502. The RF source 502 may be coupled in series with one or more inductive elements. For example, FIG. 5 illustrates an inductive element 504 and another inductive element 506. In some embodiments, the value of the inductive elements 504, 506 may be approximately equal, with a value such as approximately 1 µH, and ranging between approximately 0.1 µH and approximately 10 µH. The RF source 502, inductive element 504, and inductive element 506 may form a continuous circuit pathway, which may be referred to as a "first" circuit pathway in the power circuit 170. The one or more inductive elements may comprise two discrete inductive elements, such as inductive element 504 and inductive element 506. The one or more inductive elements may also include more or fewer than two inductive elements. The one or more inductive elements may also be conductively coupled to the RF source 502 through a conductive or wired pathway as illustrated in FIG. 5, which may be contrasted with traditional inductive coupling.

The power circuit 170 may also include a second circuit pathway that may be conductively isolated from the first circuit pathway. Instead of having a direct conductive path, the second circuit pathway may be inductively coupled to the first circuit pathway. For example, the second circuit pathway may include an inductive element 508 and another inductive element 510. These inductive elements 508, 510 may be inductively coupled with inductive elements 504, 506 such that the RF signal provided from the RF source 502 is transferred from inductive elements 504, 506 to inductive elements 508, 510. In some embodiments, inductive element 504 and inductive element 508 may be interleaved in a toroid configuration to maximize the inductive coupling between the inductive elements 504, 508. Inductive element 506 and inductive element 510 may be arranged in a similar fashion.

Inductive element 508 and inductive element 510 may be separated by a capacitive element 512. Capacitive element 512 may be implemented using a capacitor having a relatively large capacitance value, such as approximately 50 nF or greater. The value of the capacitance for capacitive element 512 may be relatively large in order to provide a low impedance for the RF signal from the RF source 502 while still being large enough to block any DC signal that would otherwise pass between inductive element 508 and inductive element 510. Note that when referring to inductive element 504 and inductive element 506 as "one or more inductive elements," inductive element 508 and inductive element 510 may be referred to as a first/second inductive elements respectively.

The power circuit 570 may also include the first DC voltage source 162 and the second DC voltage source 164. The first DC voltage source 162 may be conductively coupled to inductive element 508, while the second DC voltage source 164 may be conductively coupled to the element 510. The first DC voltage source 162 and the second DC voltage source 164 may be configured such that a voltage difference may be established between the first DC voltage source 162 and the second DC voltage source 164. Capacitive element 512 may isolate the DC signals from the first DC voltage source 162 from the DC signals from the second DC voltage source 164 in the RF power circuit 570. The voltage difference between these DC voltage sources 162, 164 may be established across the capacitive element 512.

The output of inductive element 508 that is conductively coupled to the first DC voltage source 162 may also be coupled to the first pedestal electrode 172. Similarly, the output of inductive element 510 that is conductively coupled to the second DC voltage source 164 may also be conductively coupled to the second pedestal electrode 174. These RF signals may be passed through two rods that provide an electrical pathway to the pedestal electrodes 172, 174. This arrangement allows bipolar chucking to be used to hold the substrate 154 on the support assembly 104 by virtue of the voltage difference between the first DC voltage source 162 and the second DC voltage source 164. Therefore, inductive element 508 may be considered a "first" inductive element that is inductively coupled to the one or more inductive elements (e.g., inductive elements 508, 510) and configured to receive a first portion of RF power originating from the RF source through the one or more inductive elements, and to provide the first portion of the RF power originating from the RF source for a first pedestal electrode 172 in the processing chamber 120. Similarly, inductive element 510 may be considered a "second" inductive element that is inductively coupled to the one or more inductive elements (e.g., inductive elements 508, 510) and configured to receive a second portion of RF power originating from the RF source through the one or more inductive elements, and to provide the second portion of the RF power originating from the RF source for a second pedestal electrode 174 in the processing chamber 120.

The capacitive element 512 may act as a blocking capacitor to provide DC isolation between the two pedestal electrodes 172, 174. This permits bipolar chucking while also allows RF to pass through the capacitive element 512. This arrangement also establishes a push-pull relationship between the RF signal coupled to the first pedestal electrode 172 and the RF signal coupled to the second pedestal electrode 174. This ensures that the signal is the same in each of the pedestal electrodes 172, 174. When the RF signal is fed into the support assembly 104 by the pedestal electrodes 172, 174 having the push-pull relationship, each of the two electrode locations may be approximately 180° out of phase.

In one implementation, the second pedestal electrode 174 may have a greater surface area than the first pedestal electrode 172. In one implementation, the second pedestal electrode 174 may have a greater diameter than the first pedestal electrode 172. The second pedestal electrode 174 may surround the first pedestal electrode 172. In one implementation, the first pedestal electrode 172 may function as a chucking electrode while also functioning as a first RF electrode. The second pedestal electrode 174 may be a second RF electrode that together with the first pedestal electrode 172 tunes the plasma. The first pedestal electrode 172 and the second pedestal electrode 174 may apply power at the same frequency or at different frequencies. The RF power to one or both of the first pedestal electrode 172 and the second pedestal electrode 174 may be varied in order to tune the plasma. For example, a sensor (not shown) may be used to monitor the RF energy from one or both of the first pedestal electrode 172 and the second pedestal electrode 174. Data from the sensor device may be communicated and utilized to vary power applied to the RF power source for the first pedestal electrode 172 and/or the RF source 502 for the second pedestal electrode 174.

As used herein, the terms first, second, third, fourth, fifth, etc., are used merely to distinguish between different instances of similar circuit elements. For example, a "first" inductive element 508 may be distinguished from a "second" inductive element 510. This terminology does not imply order, precedence, importance, or any other substantive characteristic of these elements, but is used only to distinguish one element from the other. Also note that this allows the first/second label to be used to distinguish any two elements. Therefore, these labels are relative, not absolute.

Figure 6:
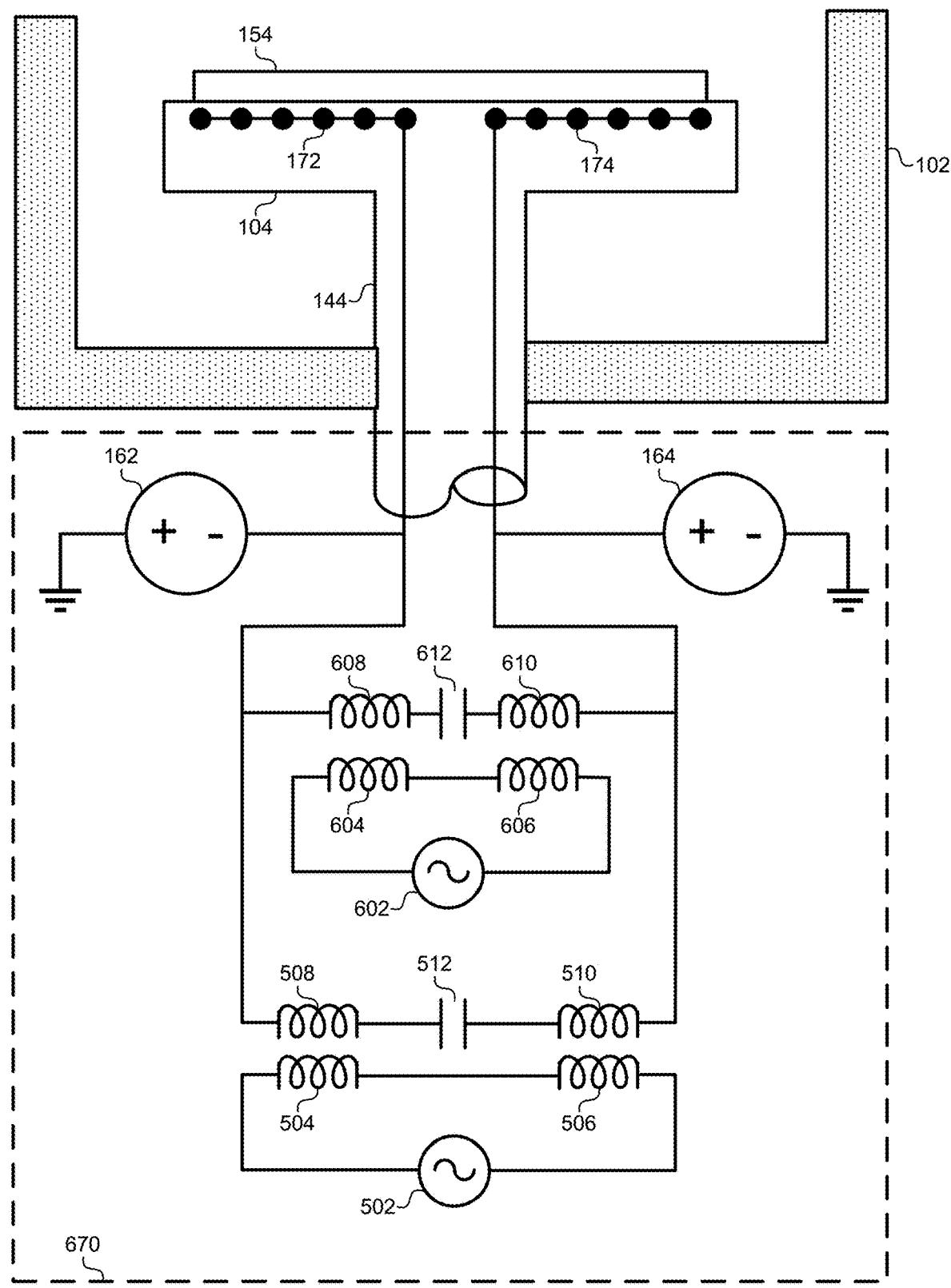
FIG. 6 illustrates a power circuit that may inject two different RF signals into the pedestal electrodes, according to some embodiments.

FIG. 6 illustrates a power circuit 670 that may inject two different RF signals into the pedestal electrodes, according to some embodiments. In this example, a second RF source 602 may be added to the power circuit 670. Some embodiments may use a 13.56 MHz frequency for the RF source 502, while using a 40.68 MHz signal for the second RF source 602. The frequency of the second RF source 602 may be different from the frequency of the RF source 502. The second RF source 602 may form a third circuit pathway that includes inductive elements 604, 606 arranged as described above for the first circuit pathway of the RF source 502. The third circuit pathway may be inductively coupled to the second circuit pathway using inductive elements 608, 610 separated by capacitive element 612. Capacitive element 612 may be similar to capacitive element 512, having a relatively large capacitance value, such as approximately 50 nF or greater such that the first DC voltage source 162 remains isolated from the second DC voltage source 164. In some cases, the values of the inductive elements 604, 606, 608, 610 between the first and third circuit pathways may be different from the values used for the inductive elements 504, 506, 508, 510 between the first and second circuit pathways. For example, the inductive elements 604, 606, 608, 610 may be configured with an inductance value that allows the RF signal from the second RF source 602 to pass while blocking the RF signal from the RF source 502. Similarly, the inductive elements 504, 506, 508, 510 may be configured with an inductance value that allows the RF signal from the RF source 502 to pass while blocking the RF signal from the second RF source 602.

This arrangement allows two different frequencies to be injected into the pedestal electrodes 172, 174 simultaneously. Note that the use of two pedestal electrodes 172, 174 is provided only by way of example and is not meant to be limiting. Other embodiments may use any number of pedestal electrodes by duplicating the circuit elements illustrated in FIG. 6. Similarly, the use of two different frequencies is provided only by way of example and is not meant to be limiting. Other embodiments may inject any number of different frequencies into the pedestal electrodes by duplicating the circuit pathways illustrated in FIG. 6 with RF sources having different frequencies and corresponding inductance values.

Figure 7:
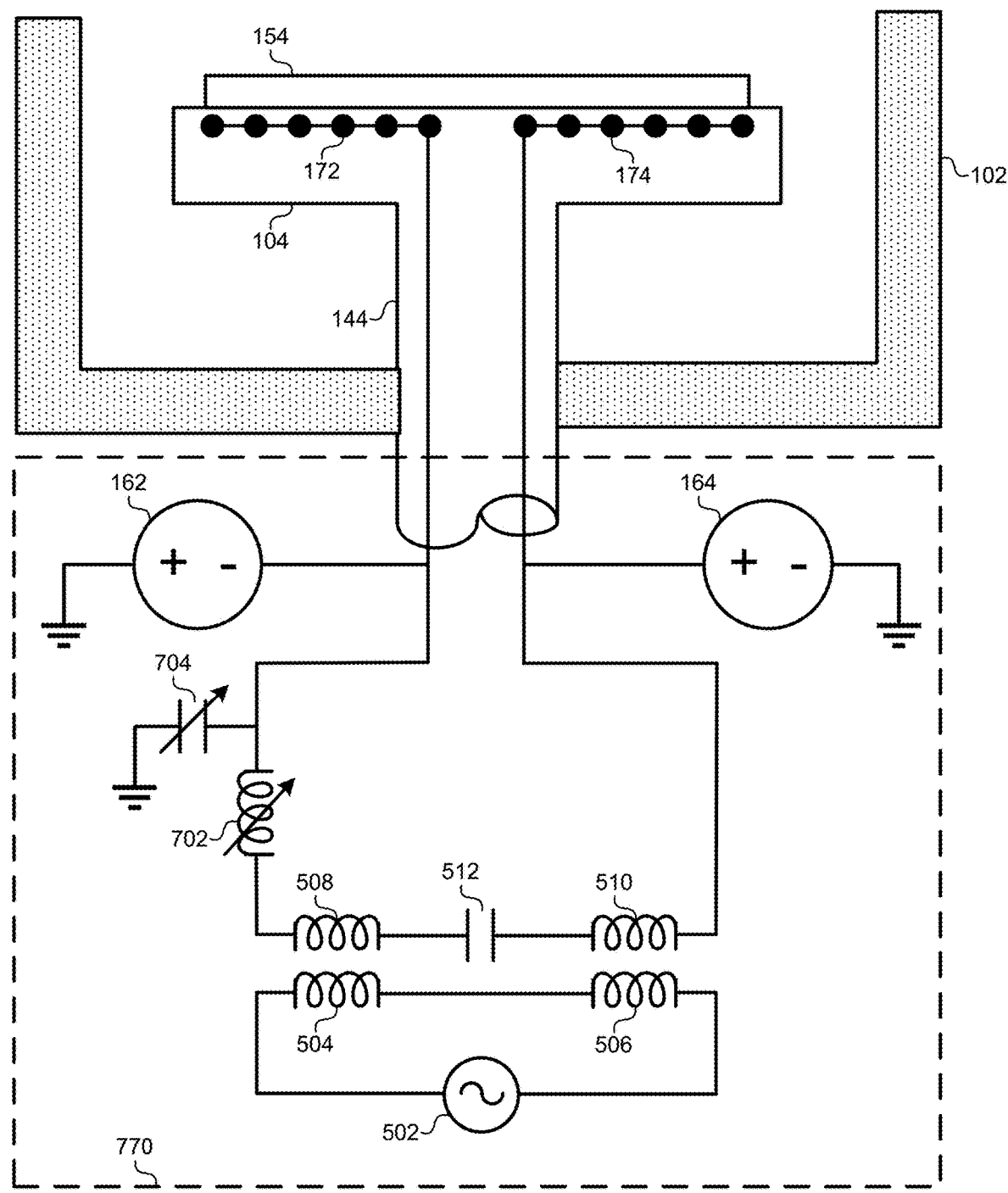
FIG. 7 illustrates a power circuit that includes tuning circuitry to skew the uniformity of the RF signal passed to each pedestal electrode according to some embodiments.

FIG. 7 illustrates a power circuit 770 that includes tuning circuitry to skew the uniformity of the RF signal passed to each pedestal electrode 172, 174, according to some embodiments. The power circuit 770 of FIG. 7 is similar to the RF power circuit 570 of FIG. 5, except that tuning circuitry has been added to the input of the first pedestal electrode 172. The tuning circuitry may include a parasitic inductor 702 and/or a parasitic capacitor 704 to siphon off current from the RF signal before it is provided to the first pedestal electrode 172. Consequently, this causes the RF signals emitted by the first pedestal electrode 172 and the second pedestal electrode 174 to be asymmetric. This can be used to compensate for irregularities in the processing chamber. While an ideal processing chamber may benefit from a purely symmetric RF output, many processing chambers (particularly smaller chambers) may generate inherent abnormalities in the plasma based on the electrical and/or physical characteristics of the processing chamber. The tuning circuitry may be used to adjust the output of one side of the power circuit 772 compensate for abnormalities in the processing chamber. For example, tuning the RF output of the first pedestal electrode 172 using the parasitic capacitor 704 and/or the parasitic inductor 702 may be used to skew the RF waveform generated in the plasma from one side to the other.

Figure 8:
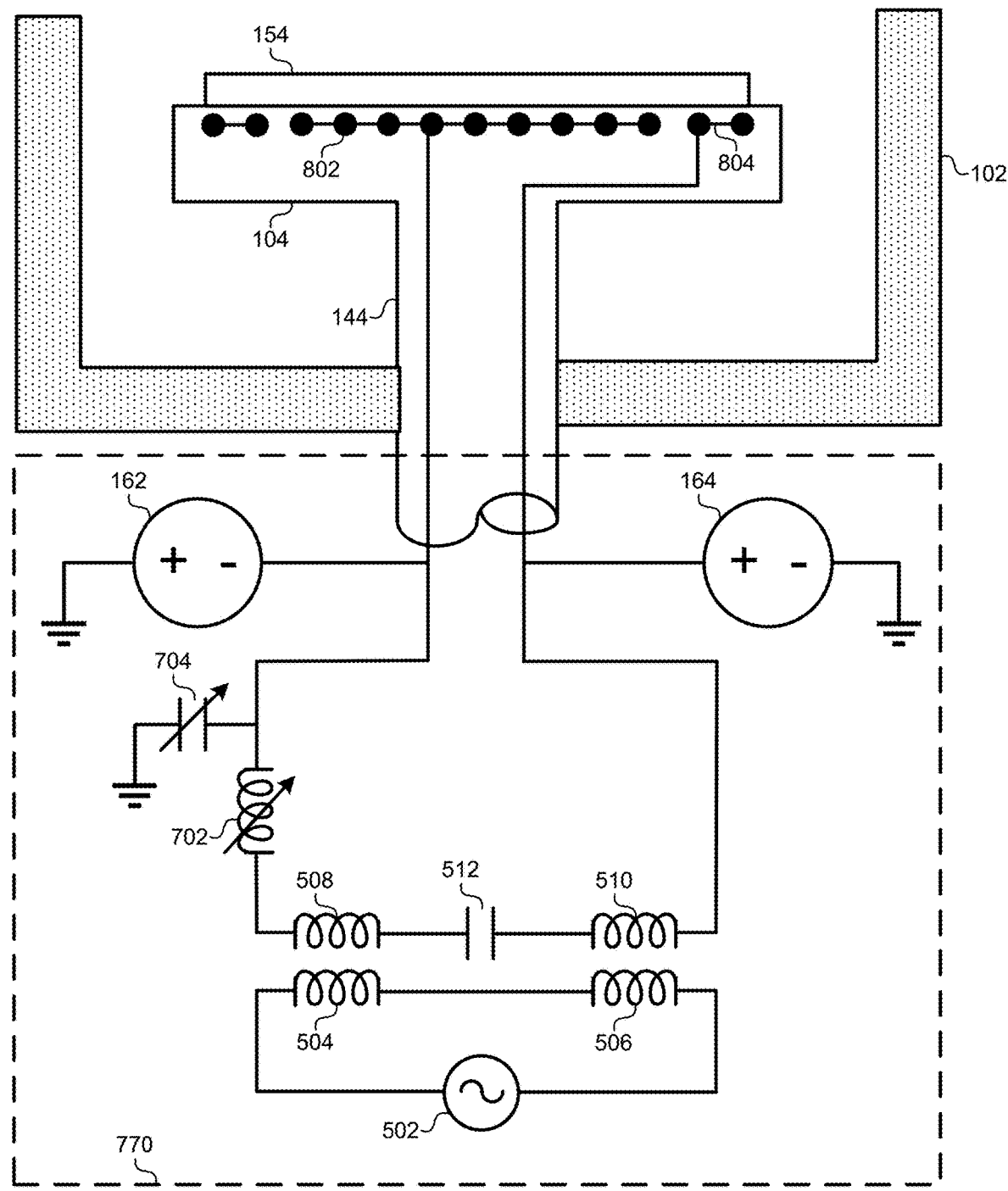
FIG. 8 illustrates pedestal electrodes in a concentric arrangement in the support assembly with tuning circuitry, according to some embodiments.

FIG. 8 illustrates pedestal electrodes 802, 804 in a concentric arrangement in the support assembly 104 with tuning circuitry, according to some embodiments. The power circuit 770 in FIG. 8 may be the same as the power circuit 770 in FIG. 7. However, the first pedestal electrode 802 may form a circular wire mesh in the center of the support assembly 104, while the second pedestal electrode 804 may form a concentric ring around the outside perimeter of the support assembly 104. For example, the first pedestal electrode 802 and the second pedestal electrode 804 may be arranged as depicted in FIG. 4. The tuning circuitry may be used as described above to compensate for abnormalities in the processing chamber by skewing the RF waveform generated in the plasma for a center-to-edge nonuniformity caused by the processing chamber.

Figure 9:
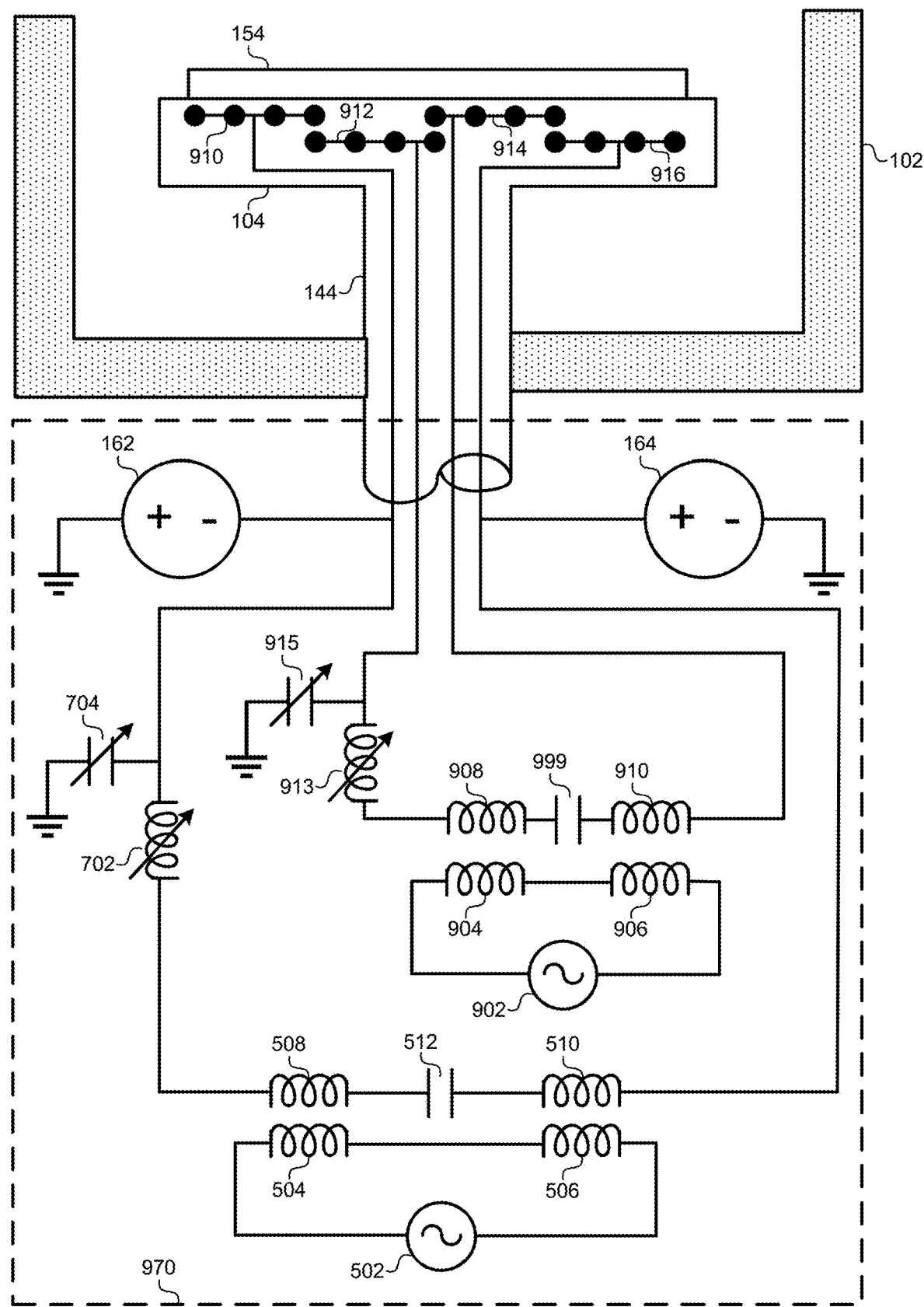
FIG. 9 illustrates a power circuit for a four-quadrant implementation, according to some embodiments.

FIG. 9 illustrates a power circuit 970 for a four-quadrant implementation, according to some embodiments. A first pedestal electrode 910 and a second pedestal electrode 916 may occupy opposite quadrants of the support assembly 104 as depicted in FIG. 4. Similarly, a third pedestal electrode 912 and a fourth pedestal electrode 914 may also occupy opposite quadrants. The circuitry in the power circuit 970 that drives the first/second pedestal electrodes 910, 916 (e.g., RF source 502, inductive elements 504, 506, 508, 510, capacitive element 512, etc.) may be duplicated to separately power the third/fourth pedestal electrodes 912, 914 (e.g., RF source 902, inductive elements, 904, 906, 908, 910, capacitive element 913, tuning circuit capacitor 915, and tuning inductor 999).

This configuration generates a rotating push-pull circuit that rotates an oscillating field circularly around the plasma. In some embodiments, a frequency difference between the RF source 502 and the RF source 902 may control the rate at which the field rotates in the plasma. For example, the frequency difference may be between approximately 1 kHz and approximately 100 kHz. At a difference of 1 kHz, the rotation around the plasma may take approximately 1 ms, while at a difference of 100 kHz, the rotation around the plasma may take approximately 10 µs. Generally, rotation speeds within this range are desirable such that the movement of the field in the plasma is sufficient to average out any momentary nonuniformities over time. In some embodiments, the frequency difference may be kept above 5 kHz to avoid issues with the reflective power fluctuation, which may make it difficult for the RF source 502 to generate a steady power.

Figure 10:
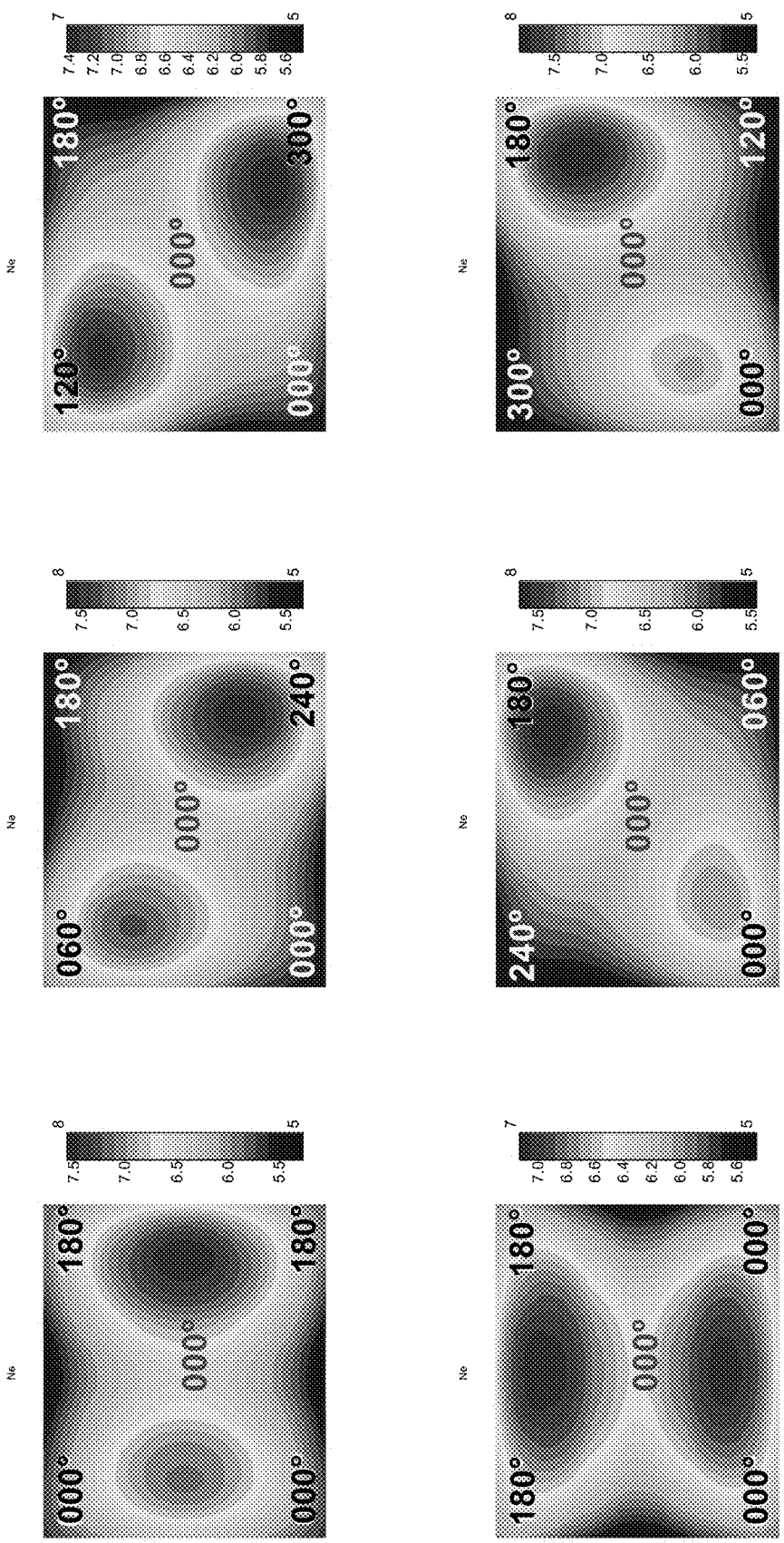
FIG. 10 illustrates a series of charts that illustrate the effect of a rotating RF field in a four-electrode configuration as illustrated in FIG. 9, according to some embodiments.

FIG. 10 illustrates a series of charts that illustrate the effect of a rotating RF field in a four-electrode configuration as illustrated in FIG. 9, according to some embodiments. In this example, the mesh can be subdivided into four paired quadrants on the support assembly 104. When operating in a push-pull drive configuration, the standing wave can both oscillate and rotate around the plasma. When the push-pull pairs are operated at slightly different frequencies. An overall push-pull across the diameter of the plasma may rotate smoothly at a rate equal to the frequency difference, shifting back and forth between the different mesh combinations. Tuning elements may be added as illustrated in FIG. 9, or a push-pull phase difference off from 180 degrees may be introduced to add a center-edge component that will also rotate.

Figure 11:
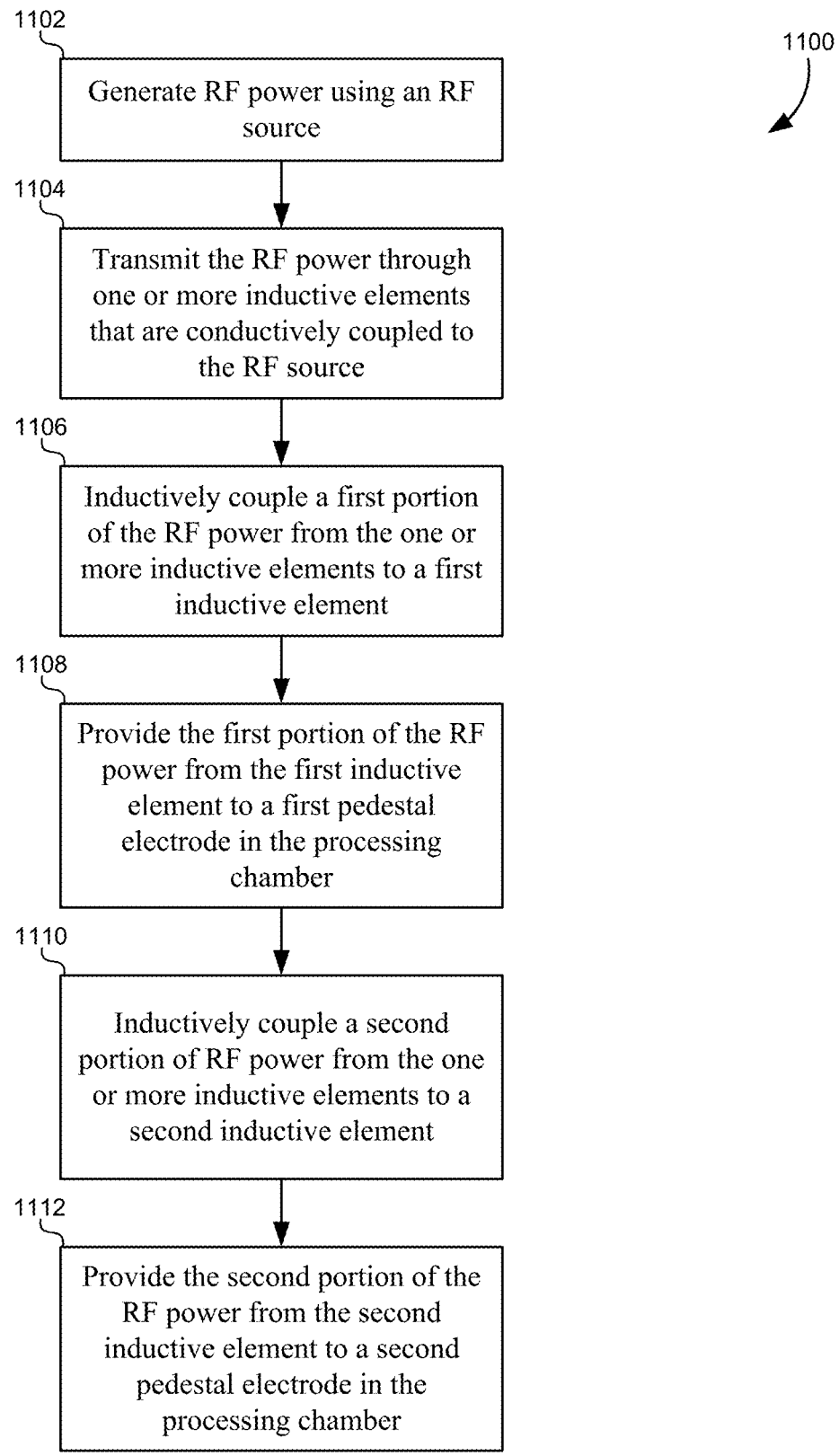
FIG. 11 illustrates a flowchart of a method for powering a multi-electrode cathode in a processing chamber, according to some embodiments.

FIG. 11 illustrates a flowchart 1100 of a method for powering a multi-electrode cathode in a processing chamber, according to some embodiments. The method may include generating RF power using an RF source (1102). The RF source may use any of the frequencies described above, and may be integrated into a power circuit as shown by the RF source 502 in FIGS. 5-9 above.

The method may also include transmitting the RF power through one or more inductive elements that are conductively coupled to the RF source (1104). The one or more inductive elements may include one or more inductors, such as the inductive elements 504, 506 illustrated in FIGS. 5-9 above. Note that a single inductive element may be used, or more than two inductive elements may be used in different embodiments.

The method may additionally include inductively coupling a first portion of the RF power from the one or more inductive elements to a first inductive element (1106). For example, the first portion of the RF power may be the portion of the RF power from the RF source 502 that is inductively coupled from the inductive element 504 to the inductive element 508 in FIGS. 5-9 above.

The method may further include providing the first portion of the RF power from the first inductive element to a first pedestal electrode in the processing chamber (1108). For example, this first portion of the RF power may be provided from the inductive element 508 to the first pedestal electrode 172 as shown in FIGS. 5-9 above.

The method may also include inductively coupling a second portion of RF power from the one or more inductive elements to a second inductive element (1110). For example, the second portion of the RF power may be the portion of the RF power from the RF source 502 that is inductively coupled from the inductive element 506 to the inductive element 510 in FIGS. 5-9 above.

The method may additionally include providing the second portion of the RF power from the second inductive element to a second pedestal electrode in the processing chamber (1112). For example, this second portion of the RF power may be provided from the inductive element 510 to the second pedestal electrode 174 as shown in FIGS. 5-9 above.

It should be appreciated that the specific steps illustrated in FIG. 11 provide particular methods of powering a multi-electrode cathode in a processing chamber according to various embodiments. Other sequences of steps may also be performed according to alternative embodiments. For example, alternative embodiments may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. Many variations, modifications, and alternatives also fall within the scope of this disclosure.

Throughout this disclosure, the term "approximately" may be used to describe values that occur within a range of −15% to +15% of the stated value. For example, a capacitance of approximately 100 nF may fall within the range of 85 nF to 115 nF.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A radio-frequency (RF) power circuit for a multi-electrode cathode in a processing chamber, the power circuit comprising:
    an RF source;
    one or more inductive elements that are conductively coupled to the RF source;
    a first inductive element that is inductively coupled to the one or more inductive elements, wherein the first inductive element is configured to receive a first portion of RF power originating from the RF source through the one or more inductive elements, and to provide the first portion of the RF power originating from the RF source for a first pedestal electrode in the processing chamber;
    a second inductive element that is inductively coupled to the one or more inductive elements, wherein the second inductive element is configured to receive a second portion of RF power originating from the RF source through the one or more inductive elements, and to provide the second portion of the RF power originating from the RF source for a second pedestal electrode in the processing chamber; and
    a capacitive element that separates the first inductive element from the second inductive element.

2. The RF power circuit of claim 1, wherein the one or more inductive elements comprises a third inductive element and a fourth inductive element, wherein the third inductive element is inductively coupled to the first inductive element, and the fourth inductive element is inductively coupled to the second inductive element.

3. The RF power circuit of claim 1, further comprising:
    a second RF source;
    second one or more inductive elements that are conductively coupled to the RF source;
    a third inductive element that is inductively coupled to the second one or more inductive elements, wherein the third inductive element is configured to receive a first portion of RF power originating from the second RF source through the second one or more inductive elements, and to provide the first portion of the RF power originating from the second RF source for the first pedestal electrode in the processing chamber; and
    a fourth inductive element that is inductively coupled to the second one or more inductive elements, wherein the fourth inductive element is configured to receive a second portion of RF power originating from the second RF source through the second one or more inductive elements, and to provide the second portion of the RF power originating from the second RF source for the second pedestal electrode in the processing chamber.

4. The RF power circuit of claim 3, wherein the third inductive element and the fourth inductive element have a same inductance.

5. The RF power circuit of claim 3, wherein the third inductive element and the fourth inductive element are configured to block the RF power originating from the RF source.

6. The RF power circuit of claim 5, wherein the first inductive element and the second inductive element are configured to block the RF power originating from the second RF source.

7. The RF power circuit of claim 3, wherein the RF source has a frequency of approximately 13 MHz and the second RF source has a frequency of approximately 40 MHz.

8. An RF power circuit for a multi-electrode cathode in a processing chamber, the power circuit comprising:
    an RF source;
    a first inductive element that is configured to receive a first portion of RF power originating from the RF source, and to provide the first portion of the RF power originating from the RF source for a first pedestal electrode in the processing chamber;
    a second inductive element that is configured to receive a second portion of RF power originating from the RF source, and to provide the second portion of the RF power originating from the RF source for a second pedestal electrode in the processing chamber; and
    a capacitive element that separates the first inductive element from the second inductive element.

9. The RF power circuit of claim 8, further comprising:
    a first DC source that is conductively coupled to the first inductive element; and
    a second DC source that is conductively coupled to the second inductive element, wherein the capacitive element isolates the first DC source from the second DC source.

10. The RF power circuit of claim 9, wherein a voltage difference between the first DC source and the second DC source represents a bipolar chucking voltage that holds a substrate to a pedestal in the processing chamber.

11. The RF power circuit of claim 8, further comprising:
    a tuning circuit configured to siphon a portion of the RF power such that power delivered to the first pedestal electrode is different from power delivered to the second pedestal electrode.

12. The RF power circuit of claim 11, wherein the tuning circuit comprises a parasitic inductor.

13. The RF power circuit of claim 11, wherein the tuning circuit comprises a parasitic capacitor.

14. The RF power circuit of claim 8, wherein the first pedestal electrode comprises a wire mesh.

15. A method of powering a multi-electrode cathode in a processing chamber, the method comprising:
    generating RF power using an RF source;
    transmitting the RF power through one or more inductive elements that are conductively coupled to the RF source;

inductively coupling a first portion of the RF power from the one or more inductive elements to a first inductive element;

providing the first portion of the RF power from the first inductive element to a first pedestal electrode in the processing chamber;

inductively coupling a second portion of RF power from the one or more inductive elements to a second inductive element;

providing the second portion of the RF power from the second inductive element to a second pedestal electrode in the processing chamber; and separating the first inductive element from the second inductive element using a capacitive element.

16. The method of claim 15, further comprising:

generating second RF power using a second RF source;

transmitting the second RF power through second one or more inductive elements that are conductively coupled to the second RF source;

inductively coupling a first portion of the second RF power from the second one or more inductive elements to a third inductive element;

providing the first portion of the RF power from the third inductive element to a third pedestal electrode in the processing chamber;

inductively coupling a second portion of second RF power from the second one or more inductive elements to a fourth inductive element; and providing the second portion of the second RF power from the fourth inductive element to a fourth pedestal electrode in the processing chamber.

17. The method of claim 16, wherein a phase difference between the RF source and the second RF source rotates an energy transferred to a plasma in the processing chamber.

18. The method of claim 16, wherein the first pedestal electrode, the second pedestal electrode, the third pedestal electrode, and the fourth pedestal electrode each are located in separate quadrant of the pedestal in the processing chamber.

19. The method of claim 15, wherein the first pedestal electrode comprises a circular mesh in a center of a pedestal, and the second pedestal electrode comprises a ring mesh around a periphery of the pedestal.

20. The method of claim 15, wherein the first inductive element comprises an inductive value of approximately 1 µH.

* * * * *